United States Patent [19]

Ricker

[11] 4,263,560
[45] Apr. 21, 1981

[54] LOG-EXPONENTIAL AGC CIRCUIT

[75] Inventor: Dennis W. Ricker, Linden Hall, Pa.

[73] Assignee: The United States of America as represented by the Secretary of the Navy, Washington, D.C.

[21] Appl. No.: 478,797

[22] Filed: Jun. 6, 1974

[51] Int. Cl.³ .............................................. H03G 3/20
[52] U.S. Cl. .................................. 330/129; 330/279; 343/7 AG; 455/239
[58] Field of Search .................. 325/400, 411; 330/85, 330/86, 96, 127, 129, 279; 343/7 A, 7 AG; 455/239

[56] References Cited

U.S. PATENT DOCUMENTS

| | | | |
|---|---|---|---|
| 3,740,750 | 6/1973 | Moulton | 343/16 M X |
| 3,786,506 | 1/1974 | Effinger et al. | 343/7 A |
| 4,058,809 | 11/1977 | Chudleigh, Jr. | 343/7 AG |

*Primary Examiner*—T. H. Tubbesing
*Attorney, Agent, or Firm*—R. S. Sciascia; Sol Sheinbein; Philip Schneider

[57] ABSTRACT

An AGC circuit designed to have a response-time independent of the absolute background input level comprising a variable-gain amplifier, an envelope detector receiving an input from the variable-gain amplifier, a logarithmic amplifier to convert the envelope value to its logarithm, a summer to subtract this envelope from a reference and thus generate an error signal, an integrator to integrate the error signal, and an exponential converter to convert this signal to an exponential and apply it as a control signal to the variable-gain amplifier. Thus, a uniform echo pulse may be presented to a display regardless of the background level.

4 Claims, 7 Drawing Figures

LOG-EXPONENTIAL AGC CIRCUIT

BACKGROUND OF THE INVENTION

1. Field of Invention

The present invention relates generally to automatic gain control (AGC) circuits and in particular to an AGC circuit to be used in sonar or radar systems.

2. Prior Art

Various methods have been utilized in the past to reduce the input dynamic range. They include time varying gain (TVG), automatic gain control (AGC), non-linear amplifiers (usually logarithmic) or combinations of these. Usually TVG characteristics are matched to sonar echo returns at various ranges in order to reduce the echo variation at short range where the greatest variation occurs. AGC is utilized to provide additional control at longer ranges where surfaces and bottom returns may cause a rapidly rising reverberation level at the receiver. This rapidly rising reverberation level is due to energy being reflected back to the receiver that was distributed and scattered in space due to the energy impinging on the rough seabed or the uneven water-surface. The primary disadvantage of a TVG is that it has a fixed characteristic (no feedback control) set a priori for some assumed average conditions. It thus falls to the AGC to provide the necessary correction to bring the dynamic range within desirable bounds.

An AGC, unlike a TVG, system, does not have a fixed gain characteristic but utilizes the concept of feedback to limit input variations to desirable bounds. In essence, an AGC performs three functions in order to achieve signal normalization. It estimates the average level of its own output usually by detection and smoothing, it compares this estimated average with a reference set point, and regulates the input in such a manner as to bring the output level and set point into coincidence. These functions may be implemented either digitally or continuously, however in either case the underlying concepts remain the same. The measure of efficiency of a particular AGC system lies in its ability to reduce the dynamic range at its output to a minimum while minimizing the distortion of the desired echo (signal). The AGC characteristic should be insensitive to the level of the input (its echo distortion should not be a function of the AGC gain). In the presence of stationary input noise (usually Rayleigh), the output statistics should be stationary over a wide range of input levels.

Simple AGC systems exhibit a high-pass filter characteristic with a definite low frequency cutoff. The extent to which the AGC is successful in reducing dynamic range while preserving the desired echo depends largely upon the spectral separability of the desired and undesired portions of the input envelope.

FIG. 1 is a diagram of a simple first order linear AGC system similar to that utilized often to correct minor level variations.

The input signal $R_i$ is applied to a variable-gain amplifier 20 which operates as an amplifier whose gain is a function of a control voltage. The output signal from amplifier 20 is applied to an envelope detector 22. The detected envelope is then applied to the negative terminal of summer 24. The summer 24 acts to subtract this envelope from some reference voltage and thus generate an error signal. This error signal is applied to an integrator 26 which acts to smooth out the error signal from the summer. The integrator 26 provides a low-pass filter characteristic with a high-frequency cut-off. Thus the sharp leading-edge of the echo is filtered out of the error signal and no compensation is made for its at the variable-gain amplifier 20. This is the desired result since it is only desired to keep the background level constant, not the echo return.

It is generally preferred that each echo pulse be of a uniform width (exist for a certain period of time) for easy visibility on a scope display. A problem occurs in that after the pulse leading edge (high-frequency spectrum) the automatic gain control (A.G.C.) will compensate the remaining length of the echo pulse (energy concentrated in the low frequency spectrum) at a rate depending on the input background level.

Mathematically the equations determining the system response for a linear AGC are developed as follows. Functionally, the VGA may be considered as an analog multiplier, that is $$R_o = \hat{E} R_i$$

where $\hat{E}$ is the control voltage to the VGA and where $R_i$ and $R_o$ are the bandpass input and output respectively. Denoting the envelope functions of $R_i$ and $R_o$ by $E_i$ and $E_o$ respectively, the dynamic equations may be readily written as:

$$E_o = \hat{E} E_i \tag{2}$$

$$E = K_g(R - E_o). \tag{3}$$

where R is the reference value for the system.

Differentiating (2) and using (3), we obtain $$\dot{E}_{Out} = E_i K_g (R - E_o) + E_o \left(\frac{\dot{E}_i}{E_i}\right). \tag{4}$$

It is apparent from (4) that the device is asymptotically stable at $E_o = R$ and in the absence of an input disturbance will settle to its final value exponentially according to $$E_o(t) = E_o(o^+)e^{-E_i(o^+)K_g t} + R(1 - e^{-E_i(o^+)K_g t}) \tag{5}$$

Thus the linear AGC system dynamics depend upon the input envelope level $E_i$. As can be seen in equation 5, the system time constant equals $$\frac{1}{E_i(o^+) K_g}.$$

Thus since the gain $K_g$ is a constant, the larger the input level $E_i$, the faster the system returns to its reference level. The echo pulse width will then vary according to the input background level.

FIG. 2 illustrates the situations in which an echo pulse occurs above a low and a high background level in a linear AGC. Assume that this AGC system is in a quiescent state prior to the application of a pulse. The output envelope at a time just prior to the pulse is $E_o(o^-) = R$, where R is the reference level at the summer 24.

Given a 10R echo pulse as shown in FIG. 2a, ($E_o(o^+) = 10R$), the response of the system will depend on the background level.

FIG. 2b is a graph of the linear AGC response of the circuit in FIG. 1 for a low background level. Since the background level is low, the loop gain is low and thus the time constant is high which means that the AGC will compensate for the pulse at a slow rate.

FIG. 2c is a graph of the linear AGC response for a high background level. Here the echo return is compensated very quickly after the initial rise because the loop gain is high implying a short time constant, the AGC thus reacts very quickly to the pulse, effectively shortening it.

Since radar or sonar echoes may occur against widely varying background levels, the variability of the linear AGC response is a decided disadvantage.

SUMMARY OF THE INVENTION

Briefly, the present invention removes the normal AGC circuit response-time dependence on the voltage background level $E_i$. The invention basically consists in the addition of a logarithmic amplifier and an exponential converter to the feedback path of a normal AGC circuit. Thus the AGC response is dependent on the ratio of the envelope value during the echo pulse to the envelope value before the echo pulse but with a response-time-constant dependent only on the gain of the system. Thus, the dependence of the response-time on the absolute background level is removed.

BACKGROUND OF THE INVENTION

An object of the present invention is to make the AGC response-time dependent only on the fixed loop gain $K_g$.

A further object is to reduce the variability of the AGC response time with background level.

Other objects, advantages and novel features of the present invention will become apparent from the following detailed description of the invention when considered in conjunction with the accompanying drawings.

DETAILED DISCUSSION OF THE INVENTION

Figure 1:
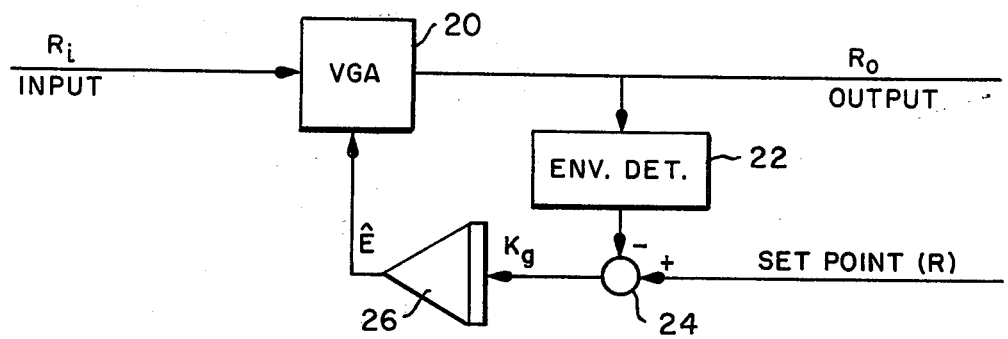
FIG. 1 is a prior art AGC circuit.
Figure 3:
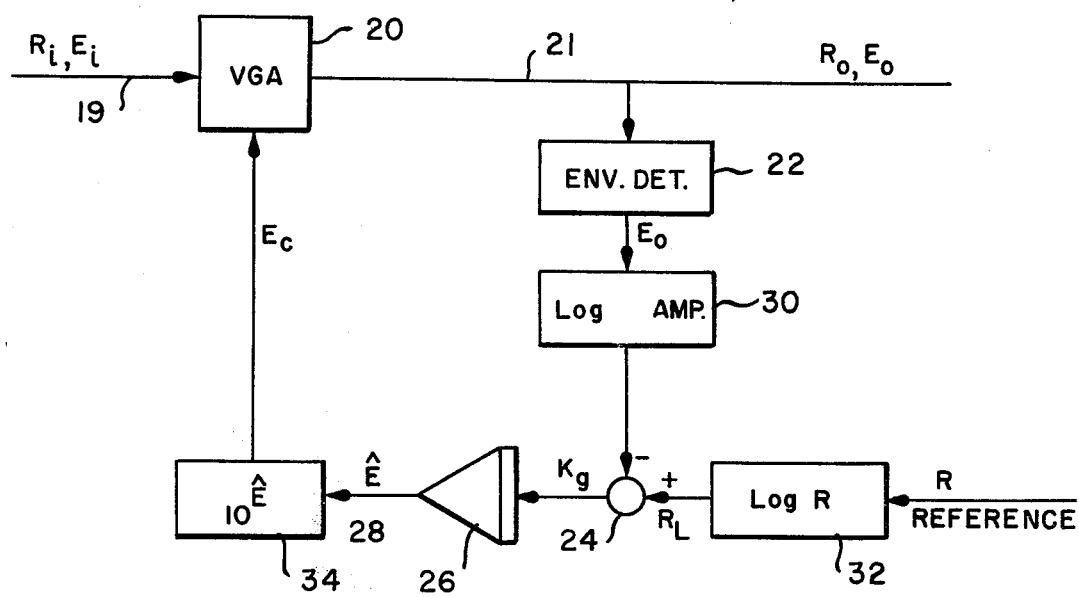
FIG. 3 is an embodiment of the present invention.
Figure 2A:
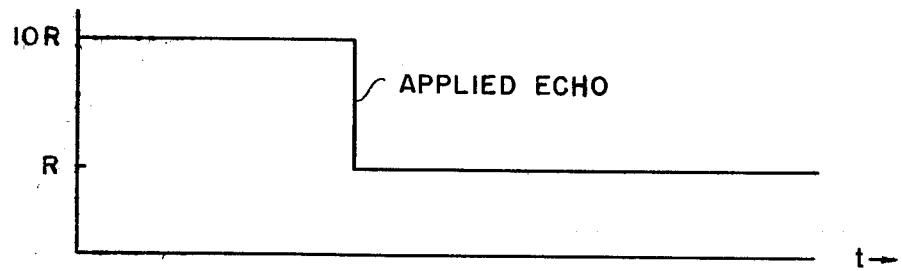
FIGS. 2a, 2b, 2c are graphs of the prior art AGC response to a pulse at varying background levels.
Figure 2B:
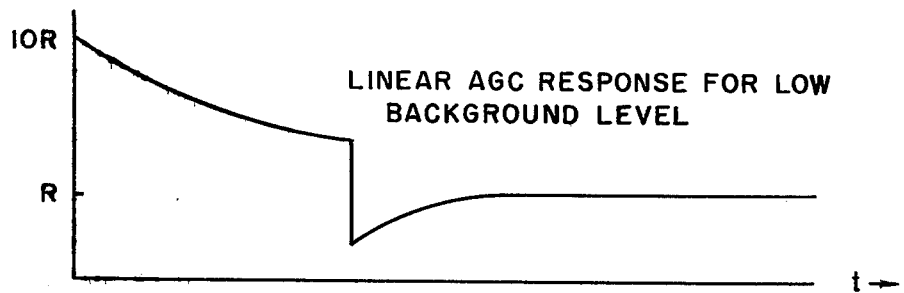
Figure 2C:
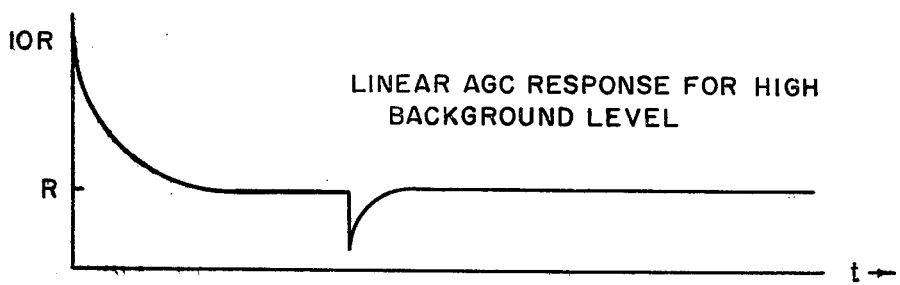

FIG. 3 is an embodiment of the present invention. A logarithmic amplifier 30, a logarithmic converter 32, and an exponential converter 34 have been inserted into the prior art AGC circuit of FIG. 1 to remove the dependence of the AGC response on the absolute value of the background level.

This circuit operates as follows: An input signal $R_i$ with an envelope $E_i$ is applied to a variable-gain amplifier 20. The output of this variable-gain amplifier is applied to an envelope detector 22 which detects the output envelope and applies it to a logarithmic amplifier 30. The logarithmic value of the envelope is then applied to the negative terminal of a summer 24. The logarithmic value of a reference envelope is applied to the positive terminal of the summer 24. Thus the log of the output envelope is subtracted from the reference envelope log and an error signal is produced. This error signal is applied to an integrator 26 with a low-pass filter characteristic.

The integrator filters out the high frequencies (leading-edge of the echo) of the error signal and applies the integrated error signal to an exponential converter 34. The exponential error signal is then applied as the control voltage to the variable-gain amplifier 20.

What the addition of the log amplifier 30 and the exponential converter 34 does is to convert the error signal from a linear voltage scale to a logarithmic (db) scale. Thus, approximately the same correction is used for both very large and very small background levels (error signals).

Mathematically this can be shown as follows:

$E_o$ = output envelope on line 21
$E_i$ = input envelope on line 19
$R_L$ = log R
$E_C$ = control voltage to the variable-gain amplifier on line 28
$E_o = 10^E E_i$
$\dot{E} = K_g(R_L - \text{Log} E_o)$ Assume the following initial conditions:

$E_o(t) = E_o(o^-) - \kappa \leq t < 0$ $E_i(t) = E_i(o^-) - \kappa \leq t < 0$ $E_i(t) = E_i(o^+) \; t = 0$ And note that the integrator cannot reflect an instantaneous change at its input.

After a long derivation, the general equation for the output envelope was found to be:

$$E_o(t) = \frac{R^{(1-e^{-K_g t})} E_o(o^-)^{e^{-K_g t}} E_i(t)}{E_i(o^-)^{e^{-K_g t}} 10 \left[ K_g \int_o^t e^{-K_g(t-\lambda)} \text{Log}_{10} E_i(\lambda) \, d\lambda \right]}$$

A step response is generally a good indicator of how an AGC system reacts to an echo with sufficient strength to be observed in the input envelope. Thus, assuming that the AGC is at equilibrium $(E_o(o^-) = R)$ before the pulse is applied, then when the pulse is applied to the system $(E_i(t) = E_i(o^+))$, and these values of $E_o(o^-)$ and $E_i(t)$ are substituted into the equation for $E_o(t)$, the following equation is obtained.

$$E_o(t) \text{ for a step} = R \left[ \frac{E_i(o^+)}{E_i(o^-)} \right]^{e^{-K_g t}}$$

for $t \geq o$.

Thus the response of the system to a step is a function only of the reference level R and the ratio $$\frac{E_i(o^+)}{E_i(o^-)}$$

of the input step to the background level before the step. Most importantly, the time constant for the dynamic response of the system is equal to $K_g$, the gain. Thus by controlling the gain of the system, the echo pulse width can be made uniform over a variety of background levels.

Now this AGC dynamic response is no longer dependent upon the absolute level of the background as in linear AGC circuits. Echoes occuring at all background levels will elicit an identical response from the AGC so long as this step ratio is preserved. This is because the time constant for system response is inversely proportional only to the gain.

The log-arithmic amplifier and the exponential converter can be set to any base desired.

Obviously, such a system can handle rapidly rising or rapidly falling background levels with ease.

Figure 4:
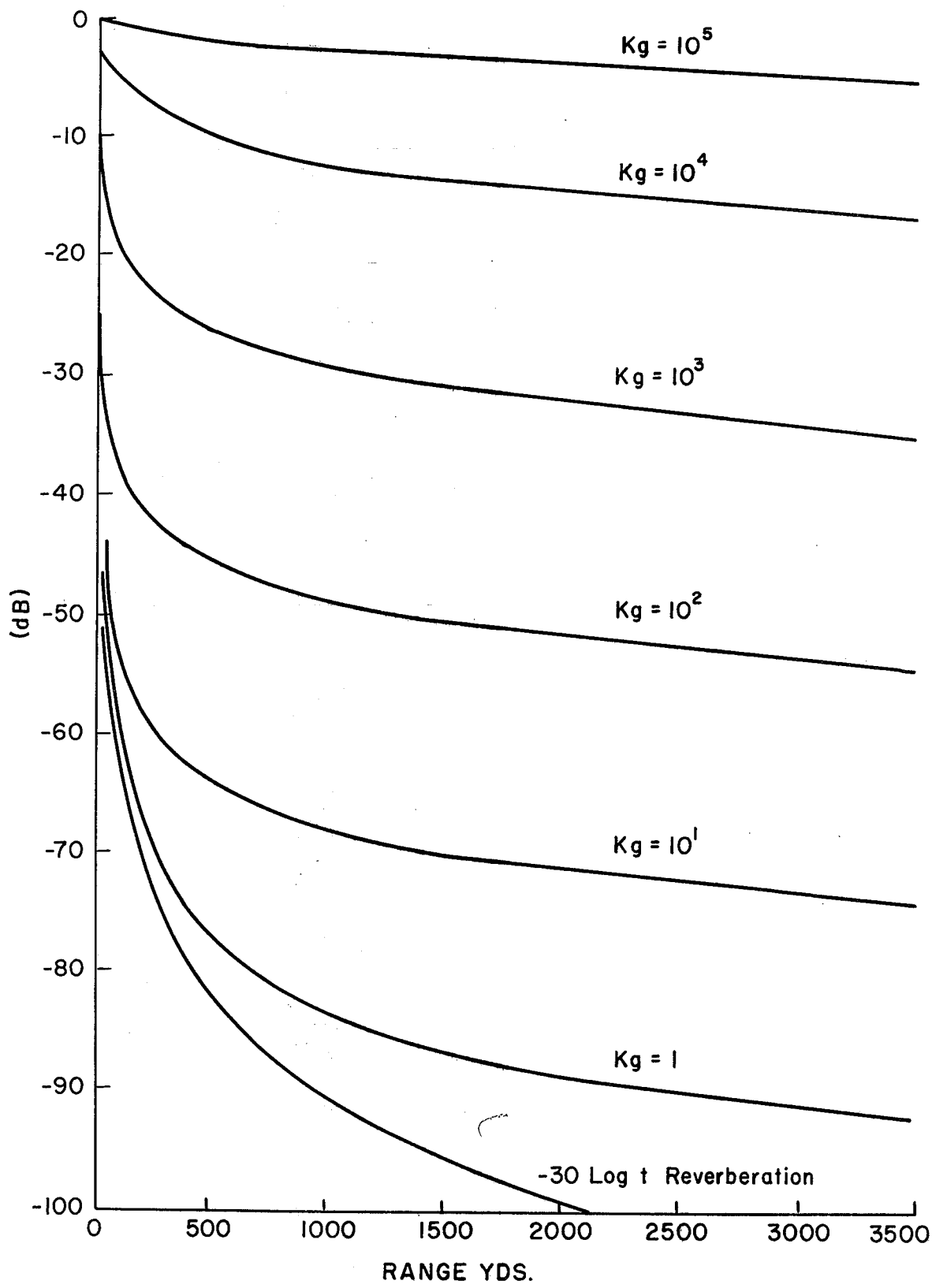
FIG. 4 is a graph of the response of a linear AGC to a rapidly dropping background level.
Figure 5:
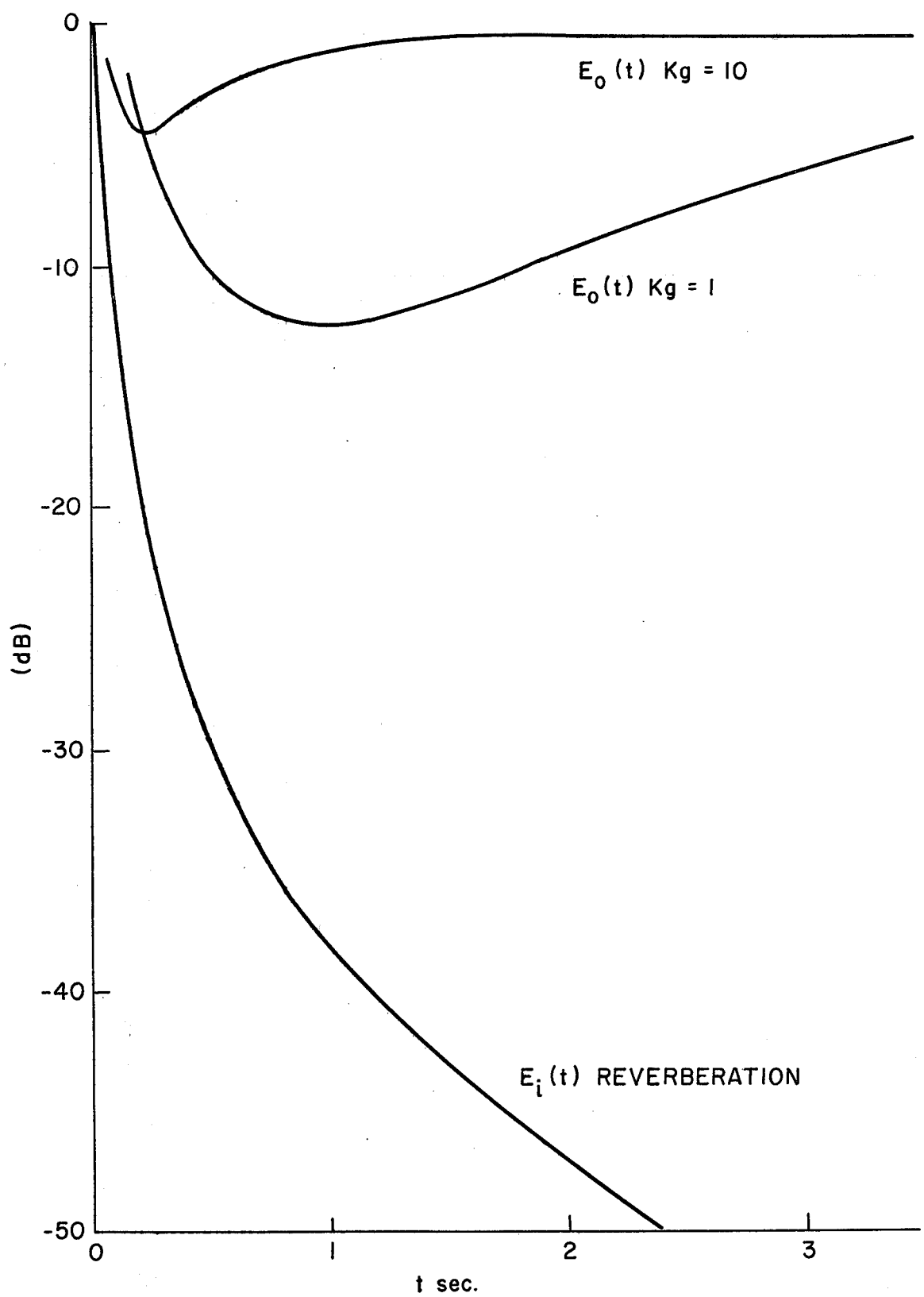
FIG. 5 is a graph of the response of the AGC of the present invention to a rapidly dropping background level.

An example of this capability is shown in FIGS. 4 and 5. FIG. 4 is a graph of the response of a linear AGC for various gain values ($K_g$) to a monotonically dropping background or reverberation level. Extremely large gains are required even to approach a reference level. Even then, there is a gradual level drop-off. FIG. 5 is a graph of the output level of the AGC system shown in FIG. 3 at gains of 1 and 10 for a monotonically dropping background (reverberation level). This input background level is labeled $E_i(t)$. After an initial drop, the system quickly approaches its reference level R again. Thus the dynamic range reduction ability of the present AGC system is much superior to that of the linear AGC with equivalent gain.

Obviously, many modifications and variations of the present invention are possible in light of the above teachings. It is therefore to be understood that, within the scope of the appended claims, the invention may be practiced otherwise than as specifically described.

I claim:

1. A non-linear, automatic-gain-control circuit comprising:
    variable-gain amplifier means to which an input signal is applied;
    envelope-detecting means for detecting the envelope of the output from said variable-gain amplifier means;
    means for converting the envelope value to its logarithmic value;
    means for generating an integrated error signal from said logarithmic envelope;
    means for converting this error signal to its exponential value and applying this signal to said variable-gain amplifier for controlling the gain of said amplifier.

2. A non-linear, automatic-gain-control circuit as in claim 1, wherein said means for converting the envelope to its logarithmic value is a logarithmic amplifier.

3. A non-linear, automatic-gain-control circuit as in claim 1, wherein said means for converting the envelope value to its logarithmic value and said means for converting the error signal to its exponential value use the base 10.

4. A non-linear, automatic-gain-control circuit as in claim 1, wherein said means for generating an error signal further comprises:
    summing means with a positive and a negative terminal, the logarithmic envelope being applied to the negative terminal of said summing means and the logarithmic value of a reference envelope being applied to the positive terminal of said summing means; and
    integrating means with a low-pass filter characteristic to which the output from said summing means is applied, said integrating means applying its output to said means to convert the error signal to its exponential value.

* * * * *